(12) United States Patent
Al-Absi

(10) Patent No.: US 12,025,505 B2
(45) Date of Patent: *Jul. 2, 2024

(54) TEMPERATURE MEASUREMENT AND INFORMATION SYSTEM

(71) Applicant: KING FAHD UNIVERSITY OF PETROLEUM AND MINERALS, Dhahran (SA)

(72) Inventor: Munir A. Al-Absi, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 18/317,954

(22) Filed: May 16, 2023

(65) Prior Publication Data

US 2023/0288267 A1 Sep. 14, 2023

Related U.S. Application Data

(63) Continuation of application No. 15/902,503, filed on Feb. 22, 2018, now Pat. No. 11,747,212.

(51) Int. Cl.
  *G01K 7/01* (2006.01)
  *H01L 27/088* (2006.01)

(52) U.S. Cl.
  CPC ............... *G01K 7/01* (2013.01); *G01K 7/015* (2013.01); *H01L 27/088* (2013.01)

(58) Field of Classification Search
  CPC ......... G01K 7/01; G01K 7/015; H01L 27/088
  See application file for complete search history.

(56) References Cited

U.S. PATENT DOCUMENTS

| | | |
|---|---|---|
| 2005/0099239 A1 | 5/2005 | Matsuura |
| 2005/0195672 A1 | 9/2005 | Lee |
| 2011/0001546 A1 | 1/2011 | Guo et al. |
| 2013/0170520 A1 | 7/2013 | Englasyam |
| 2016/0138978 A1 | 5/2016 | Eberlein |
| 2019/0120699 A1 | 4/2019 | Wang |

FOREIGN PATENT DOCUMENTS

JP   2010-176258 A   8/2010

OTHER PUBLICATIONS

Baek, et al. "Large Temperature Coefficient PTAT Current Reference using Weak Inversion CMOS FET Resistor." Circuits and Systems, 2007. MWSCAS 2007. 50th Midwest Symposium on. IEEE, 2007.

(Continued)

*Primary Examiner* — Brandi N Hopkins
*Assistant Examiner* — Janice M Soto
(74) *Attorney, Agent, or Firm* — Oblon, McClelland, Maier & Neustadt, L.L.P.

(57) ABSTRACT

The present disclosure relates to a compact temperature sensor displaying a temperature-resistance relationship. The temperature sensor comprises cross-coupled CMOS technology exhibits negative resistance, resulting in resistance-sensitive temperature sensing and amplification. The temperature sensor can be tuned to operate across a wide range of temperatures via modulation of a biasing current. The present disclosure further relates to subthreshold operation of CMOS technology.

15 Claims, 10 Drawing Sheets

(56) References Cited

OTHER PUBLICATIONS

Al-Tamimi, Karama and Al-Absi, Munir, "An ultra low power high accuracy current-mode CMOS squaring circuit," The World Congress on Engineering and Computer Science (WCECS 2012), Proceedings of. San Francisco, USA, International Association of Engineers (IAENG), 2012.
Bota, et al., "MOSFET-based temperature sensor for standard BCD smart power technology," Microelectronics Journal vol. 32, Issues 10-11 (2001), pp. 869-873.
A. Hajimiri and R. Heald, "Design issues in cross-coupled inverter sense amplifier," ISCAS '98. Proceedings of the 1998 IEEE International Symposium on Circuits and Systems (Cat. No. 98CH36187), Monterey, CA, 1998, pp. 149-152 vol. 2, doi: 10.1109/ISCAS.1998.706863. (Year: 1998).

TEMPERATURE MEASUREMENT AND INFORMATION SYSTEM

CROSS-REFERENCE TO RELATED APPLICATIONS

The present application is a Continuation of U.S. application Ser. No. 15/902,503, now allowed, having a filing date of Feb. 22, 2018.

ACKNOWLEDGEMENT

This invention was made possible with generous support from King Fahd University.

BACKGROUND

Field of the Disclosure

The present disclosure relates to a tunable complementary metal-oxide-semiconductor-based (CMOS) temperature sensor.

Description of the Related Art

In a variety of environments, the ability to accurately determine temperature is mission-critical. This is due, in part, to the temperature dependence of most electronic circuits and systems. Measurement and control of temperature is, therefore, mandatory.

A number of approaches to sensor design have been developed to address this need. Recently, emerging technologies have focused on the use of sensors exhibiting improved efficiency while requiring low calibration costs and low power supply voltages for operation. These recent designs include operational amplifiers with reference generators, temperature to pulse generators wherein two lines are utilized along with exclusive OR gates, CMOS integrated temperature sensors based on a proportional to absolute temperature (PTAT) source and bandgap reference, a bandgap temperature sensor and a temperature sensor based on a delay line, substrate PNP transistors for sensing and reference voltage generation, a CMOS temperature sensor with operational amplifier buffers and transistors to generate PTAT and $V_{ref}$, and a RTD-based (resistance temperature detector) temperature sensor using a planer resistance temperature detector that can be manufactured via microelectronics.

Joeng et al. investigated the use of operational amplifiers with reference generators for temperature sensing. The reference proposes a fully-integrated temperature sensor for battery-operated, ultra-low power microsystems. See S. Jeong, Z. Foo, J. Y. Sim, D. Blaauw, and D. Sylvester, "A fully-integrated 71 nW CMOS temperature sensor for lower power wireless sensor nodes", published in *IEEE Journal of Solid-State Circuits*, 2014.

Kim et al. investigated the use of temperature to pulse generators wherein two lines are utilized along with exclusive OR gates. The reference proposes a multi-block system with a temperature-to-pulse generator, a time-to-digital converter, and a frequency selector. See H. W. Kim, S. H. Ann, and N. S. Kim, "CMOS Integrated Time-Mode Temperature Sensor for Self-Refresh Control in DRAM Memory Cell", published in *IEEE Sensors Journal*, 2016.

Li et al. investigated the use of CMOS integrated temperature sensors based on a proportional to absolute temperature source and bandgap reference. The reference proposes a design that applies the temperature characteristics of substrate bipolar transistors to CMOS technology. See J. Li, X. Weisheng, and Y. Youlin, "Accurate operation of a CMOS integrated temperature sensor", published in *Microelectronics Journal*, 2010.

Makinwa investigated the combination of a bandgap temperature sensor and a temperature sensor based on a delay line. The reference describes a system including a temperature sensor, bias circuitry, and an analog-to-digital converter. See K. A. A. Makinwa, "Smart temperature sensors in standard CMOS", published in *Procedia Engineering*, 2010.

Pertijs et al. investigated the use of substrate PNP transistors for sensing and reference voltage generation. The reference describes a smart temperature sensor applicable over the full military temperature range. See Pertijs, M. A. P., Makinwa, K. A. A., Huijsing, "A CMOS smart temperature sensor with a 3/spl sigma/inaccuracy of/spl plusmn/01./ spl deg/C from −55/spl deg/C to 125/spl deg/C", published in *IEEE Journal of Solid-State Circuits*, 2005.

Liangbo et al. investigated a CMOS temperature sensor with operational amplifier buffers and transistors to generate PTAT and $V_{ref}$. The reference describes the design of the CMOS smart temperature sensor, including a low power analog front-end and a 12-bit low-power successive approximation register analog-to-digital converter. See Liangbo, X., Jiaxin, L., Yao, W., and Guangjun, W., "A low-power CMOS smart temperature sensor for RFID application", published in *Journal of Semiconductors*, 2014.

Santos et al. investigated a RTD-based temperature sensor using a planar resistance temperature detector that can be manufactured via microelectronics. The reference describes a nickel-RTD transducer for smart temperature sensors. See Santos, E. J. P., Ieee, S. M., Vasconelos, I. B., and Ieee, M, "RTD-based Smart Temperature Sensor: Process Development and Circuit Design", published at *International Conference on Microelectronics*, 2008.

While efforts, like the abovementioned, have been focused at developing more robust temperature sensors, the integration of RTD-sensors and CMOS-based technologies has yet to be explored. For this reason, a temperature sensor, that addresses the points above, is needed.

The foregoing "Background" description is for the purpose of generally presenting the context of the disclosure. Work of the inventors, to the extent it is described in this background section, as well as aspects of the description which may not otherwise qualify as prior art at the time of filing, are neither expressly or impliedly admitted as prior art against the present invention.

SUMMARY

The present disclosure relates to a complementary metal-oxide-semiconductor-based resistance temperature detector-sensor. Specifically, the present disclosure describes a compact low voltage and low power CMOS integrated temperature sensor.

The present disclosure further relates to a method of temperature sensing utilizing metal-oxide-semiconductor field effect transistors.

According to an embodiment, the present disclosure is related to a temperature sensing device comprising, a first circuit segment, a second circuit segment, and a processing circuitry, wherein the first circuit segment includes a one or more metal-oxide-semiconductor field effect transistors of a first conductivity type, wherein the second circuit segment includes a one or more metal-oxide-semiconductor field effect transistors of a second conductivity type, and wherein the processing circuitry is configured to determine an unknown temperature based upon a relationship between a resistance of the second circuit segment and a temperature.

According to an embodiment, the present disclosure is related to a method of measuring a temperature comprising generating, via a power supply, a signal having a voltage, receiving the signal having the voltage to a one or more metal-oxide-semiconductor field effect transistors of a first conductivity type of a first circuit segment, transmitting the signal having the voltage from the first circuit segment, measuring, via a processing circuitry, a first value from the voltage of the outputted signal from the first circuit segment, receiving the signal having the voltage to a one or more metal-oxide-semiconductor field effect transistors of a second conductivity type of a second circuit segment, transmitting the signal having the voltage from the second circuit segment, measuring, via the processing circuitry, a second value from the voltage of the outputted signal from the second circuit segment, and calculating, via the processing circuitry, the difference between the first value from the voltage outputted signal from the first circuit segment and the second value from the voltage of the outputted signal from the second circuit segment.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). Reference throughout this document to "one embodiment", "certain embodiments", "an embodiment", "an implementation", "an example" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

Temperature is an important parameter to measure in a variety of applications, such as environment monitoring, wearable biomedical devices, smart homes, and industrial internet-of-things equipment. Since devices employed in such applications often need to be ultra-small and/or unobtrusive, there is often little room for a battery or energy harvesting source. Thus, the overall power available for such systems is often limited in order to support long system lifetimes in a wide variety of applications.

To achieve minimal power consumption, efforts have focused on exploiting the temperature-dependency of electron/hole mobility, threshold voltage, and drain currents of metal-oxide-semiconductor field effect transistors (MOSFETs). Moreover, most modern electronic devices utilize CMOS technology, allowing for low-cost integration of temperature sensing and secondary functionalities.

Figure 1:
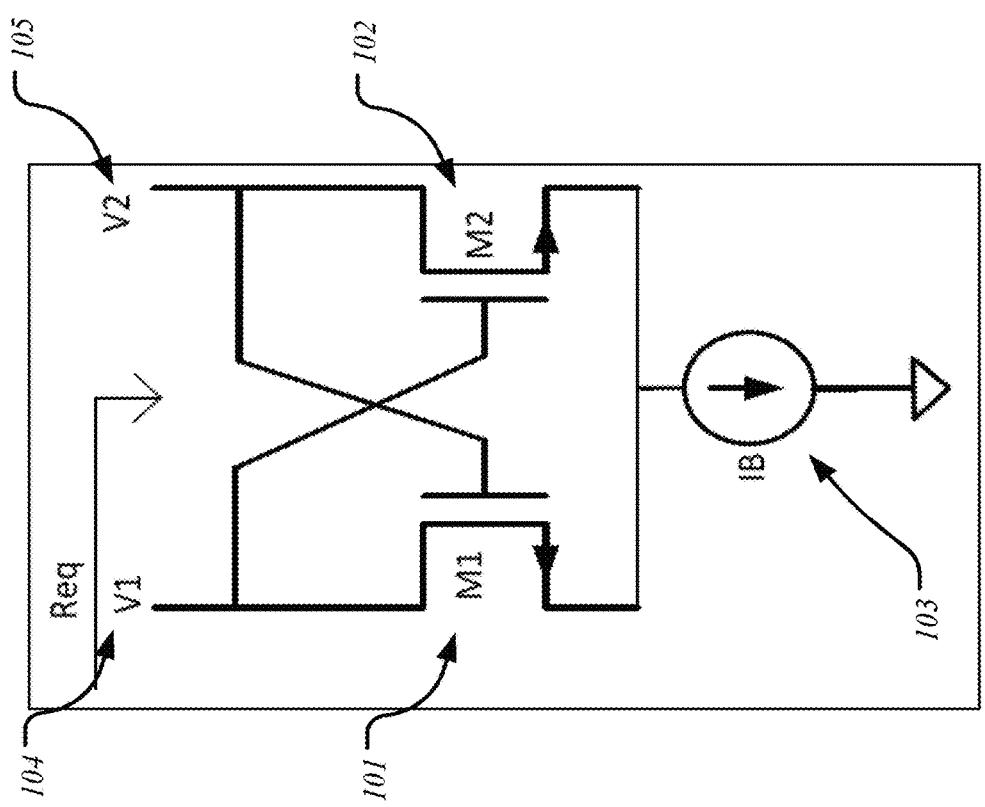
FIG. 1 is a circuit design of an aspect of an exemplary embodiment of the present disclosure.

As alluded to, the temperature sensing device of the present disclosure exploits the temperature-dependency of electron/hole mobility as a measure of resistance, eliminating the need for power-consuming passive resistors. FIG. 1 is an exemplary embodiment of an aspect of the temperature sensing circuitry of the present disclosure. In an embodiment, the design incorporates two cross-coupled NMOS transistors 101, 102 biased in the subthreshold region, thus eliminating the need for amplifiers including but not limited to operational amplifiers and current sense amplifiers. Similarly, simultaneous sensing and amplification ensures minimal form factor by eliminating the need for extraneous circuitry. Theoretically, a drain current $I_D$ of MOSFETs in the subthreshold region is given by:

$$I_D = I_{DO} \frac{W}{L} e^{\frac{V_{GS}-V_{TH}}{nV_T}} \quad (1)$$

where $I_{DO}$ is a saturation current, W is a dimension of the transistor, L is channel length, n is a sub-threshold slope factor, (a constant between 1 and 2, according to material and physical structure of the transistors), and $V_T$ is a thermal voltage. To keep the MOSFETs operating in the subthreshold forward saturation region, the following conditions must be satisfied:

$$\frac{I_{DO}}{I_D} \ll 1 \text{ and } V_{DS} > 4V_T \quad (2)$$

where $V_{DS}$ is a voltage differential from the drain to the source, and $V_T$ is further defined as equal to $$\frac{kT}{q}$$

(defined below).

The small signal equivalent circuit described above, with M1 101 and M2 102 match transistors, demonstrates the equivalent resistance observed between nodes V1 104 and V2 105, so that $$R_{eq} = -\frac{2r_o}{1 + g_m r_o} \quad (3)$$

where $g_m$ is a transconductance and $r_o$ is an output resistance of M1 101 and M2 102.

In the subthreshold region, $$g_m = \frac{I_T}{nV_T} \text{ and } r_o = \frac{1}{\lambda I_D},$$

implying that $g_m r_o \gg 1$, where $\lambda$ is a length parameter of the transistors M1 101 and M2 102. Therefore, equation (3) can be rewritten as:

$$R_{eq} = -\frac{2}{g_m} = -\frac{2nV_T}{I_B/2} = -\frac{4nk}{q}\frac{T}{I_B} \quad (4)$$

where T is a temperature in Kelvin, k is the Boltzmann constant (k=8.617×10$^{-5}$ eV/K), and q is the electrical charge of an electron (q=1.602×10$^{-19}$ coulombs). It is seen in the resulting equation (4), therefore, that resistance varies linearly with temperature, creating a resistance-type temperature sensor. Therefore, the circuit design of FIG. 1 has been reduced to a linear relationship between system temperature and equivalent resistance of the MOS-based circuit design. Furthermore, modification of the remaining variable, a biasing current ($I_B$), allows for control of system sensitivity.

Figures 2A, 2B:
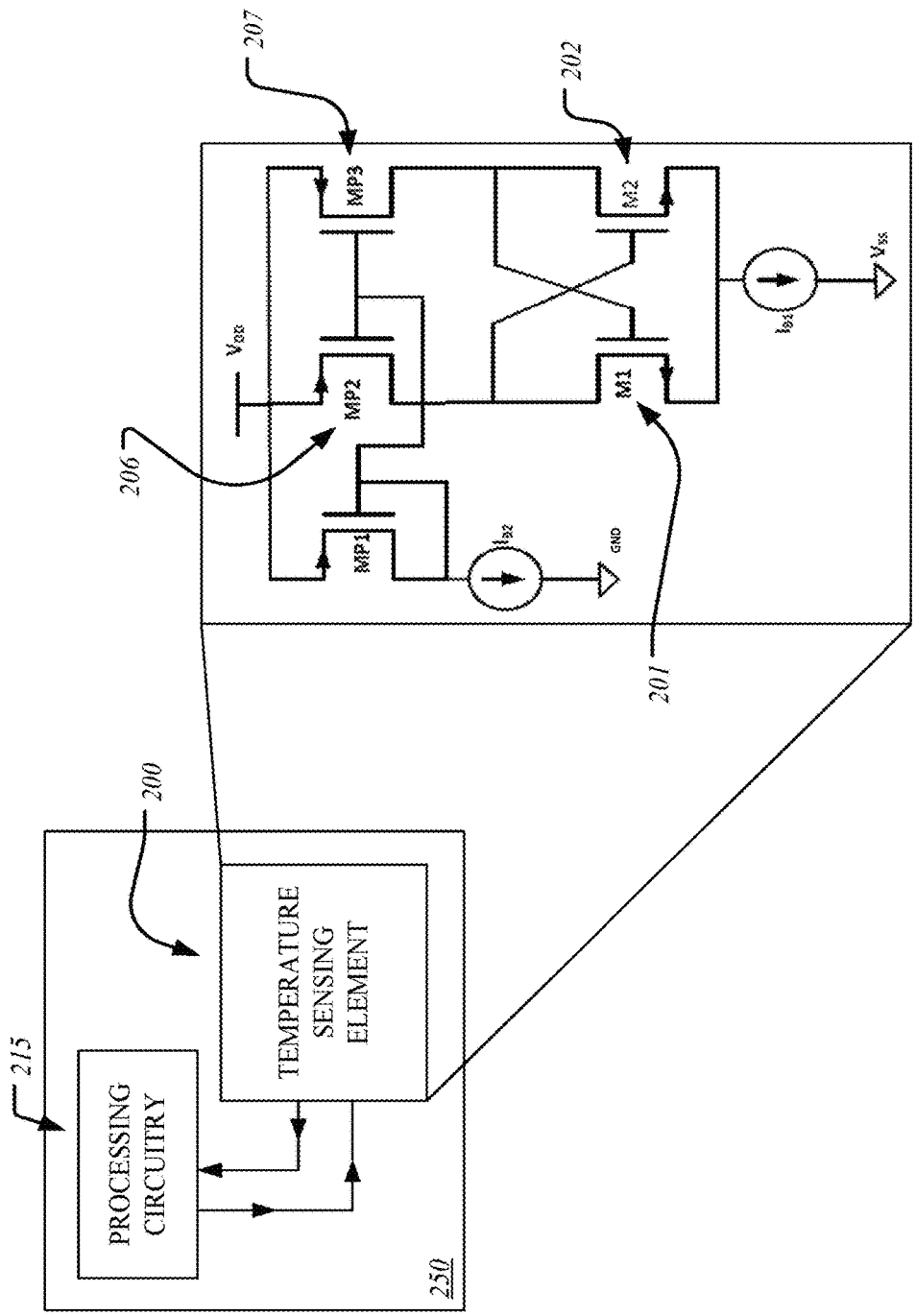
FIG. 2A is a high-level diagram of an exemplary embodiment of the present disclosure.
FIG. 2B is a circuit design of an aspect of an exemplary embodiment of the present disclosure.

The temperature sensing device in FIG. 2A and FIG. 2B incorporates the resistance-dependent MOS-based design of FIG. 1 in a realizable system. Therefore, FIG. 2A is a high-level view of the temperature sensing device. The temperature sensing device 250 is comprised of a processing circuitry 215 and a temperature sensing element 200. The processing circuitry 215 is configured to, during operation of the temperature sensing device 250, measure a voltage drop across the temperature sensing element 200 and calculate, according to (4), a temperature. The temperature sensing element 200 is further described in FIG. 2B. FIG. 2B is an exemplary embodiment of the circuit diagram of the CMOS-based temperature sensing element, including PMOS-based supporting circuitry. To ensure identical bias currents are supplied to both M1 201 and M2 202, independent of system load or resistances, the bias current through MP1 209 of $I_{B2}$=0.5 $I_{B1}$ is copied through MP2 206 and MP3 207. The 'current mirror' of the abovementioned embodiment ensures a consistent current input into transistors M1 and M2 of the sensing circuitry, and eliminates the need for diode-like technologies including but not limited to bipolar junction transistors and BiCMOS-technologies.

Figure 3:
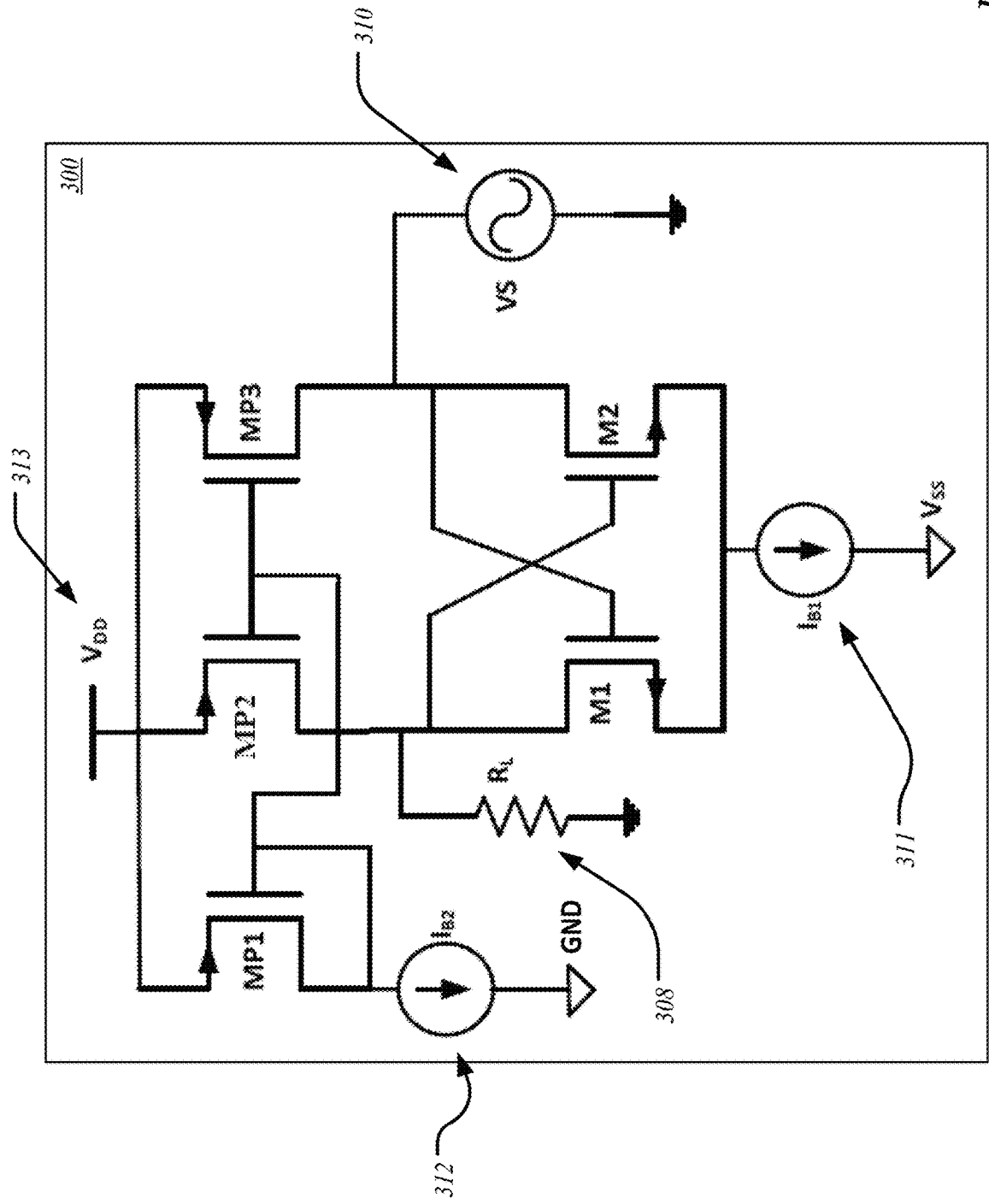
FIG. 3 is a circuit design of an aspect, used for simulation, of an exemplary embodiment of the present disclosure.

Simulations of the abovementioned temperature sensing element 300, according to FIG. 3, were completed via tanner Tspice with 0.18 µm TSMC CMOS process technology. The small signal equivalent resistance (described in FIG. 1) is connected to an AC source 310 (VS) producing a waveform at 20 mV amplitude with 10 kHz frequency. A 1 MΩ resistor 308, $R_L$, as shown in FIG. 3, is placed opposite the power source, VS, according to an exemplary embodiment of the present disclosure. A supply voltage 313, $V_{DD}$=$-V_{SS}$=0.5V, is provided. The dimensions of transistors MP1, MP2, MP3, M1, and M2 are given in Table 1, wherein MP1, MP2 and MP3 are identical, and M1 and M2 are identical. In a first simulation, the bias current $I_{B1}$ is set to 50 nA and, subsequently, the bias current $I_{B2}$ is set to 0.5 $I_{B1}$. During the simulation, and to demonstrate the range of efficacy of the design of the temperature sensing element, the temperature was varied from −50° C. to 150° C.

TABLE 1

| Transistor Sizes | |
|---|---|
| M1, M2 | 1 µm × 0.18 µm |
| MP1, MP2, MP3 | 10 µm × 2 µm |

Figure 4:
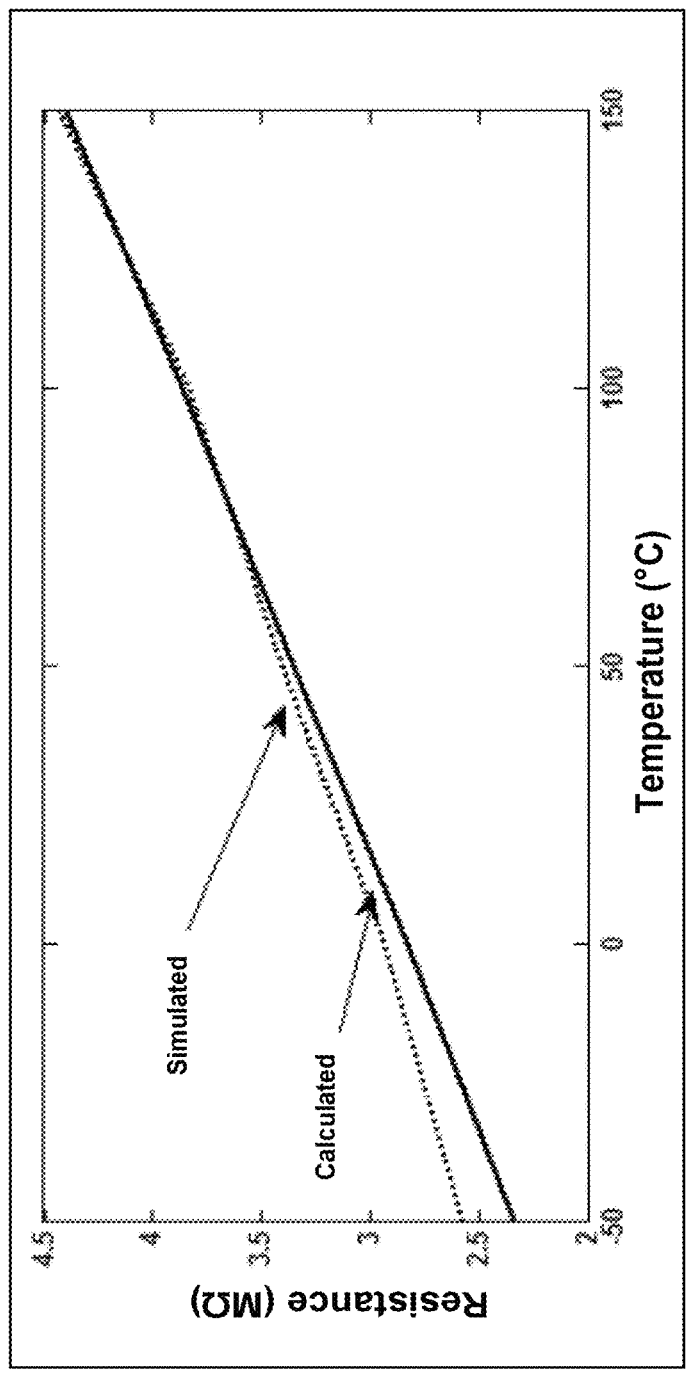
FIG. 4 is a graphical representation of the simulated performance of the circuit design as a function of resistance and temperature, according to an exemplary embodiment of the present disclosure.

FIG. 4 is a graphical representation of the calculated and simulated resistance as a function of temperature, according to an exemplary embodiment of the present disclosure. From FIG. 4, as temperature varies between −50° C. and 150° C., the resistance of the temperature sensing element varies from 2.5 MΩ to 4.5 MΩ.

Figure 5:
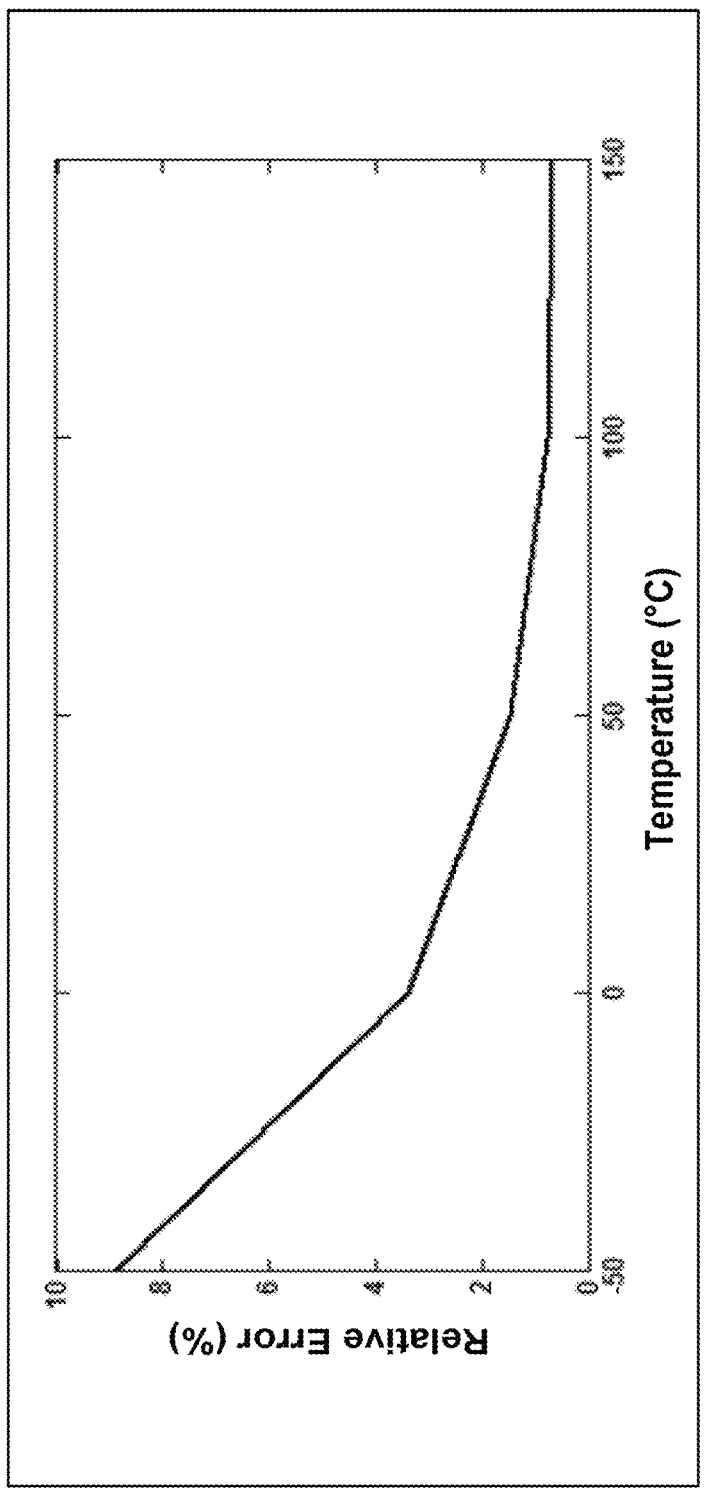
FIG. 5 is a graphical representation of the relative error of the simulated performance of the circuit design as a function of resistance and temperature, according to an exemplary embodiment of the present disclosure.

FIG. 5 is a graphical representation of the relative error of the calculated and simulated resistance as a function of temperature, according to an exemplary embodiment of the present disclosure. From FIG. 5, it is observed that there is a maximum deviation between the calculated and simulated values resulting, at least, from the selection of the subthreshold slope factor, n, in equation (4) for the calculated values of $R_{eq}$.

Figure 6:
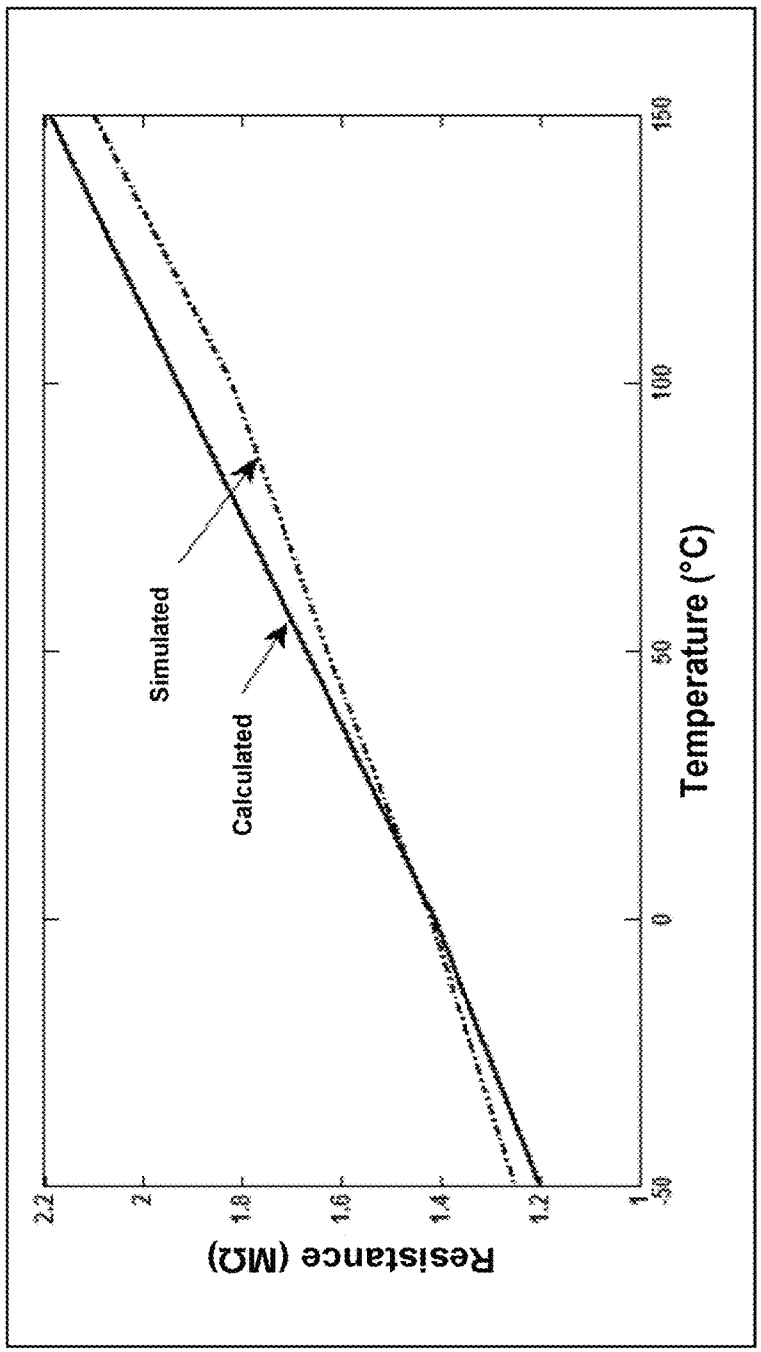
FIG. 6 is a graphical representation of performance of the circuit design as a function of resistance and temperature, according to an exemplary embodiment of the present disclosure.

FIG. 6 is a graphical representation of the calculated and simulated resistances of the temperature sensing element when the bias current, $I_{B1}$, is set to 100 nA, according to an exemplary embodiment of the present disclosure. As expected according to the mathematical relationship of (4), the resulting magnitude of the resistance response to changing temperature is reduced to half the value of the resistance when the bias current, $I_{B1}$, is set to 50 nA.

Figure 7:
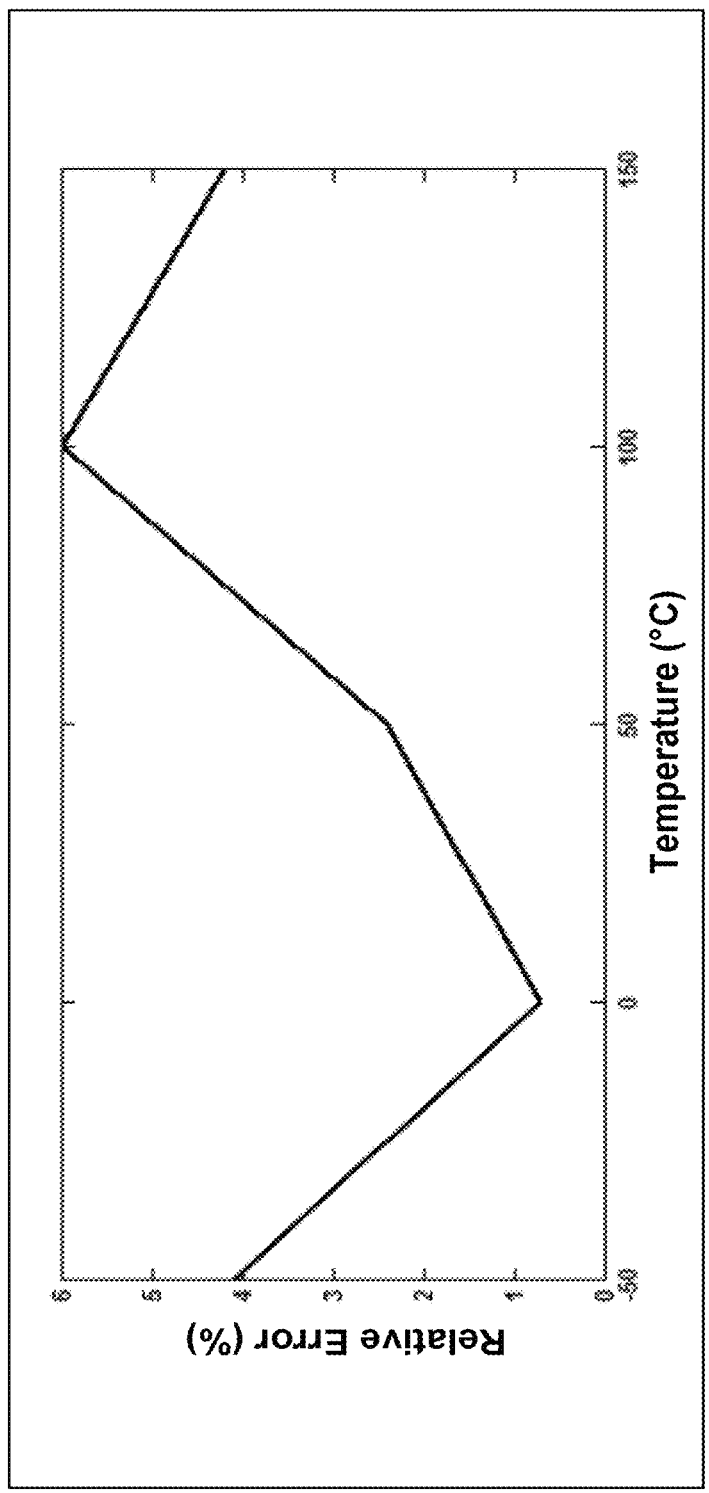
FIG. 7 is a graphical representation of the relative error of the simulated performance of the circuit design as a function of resistance and temperature, according to an exemplary embodiment of the present disclosure.

FIG. 7 is a graphical representation of the relative error of the calculated and simulated resistance as a function of temperature, according to an exemplary embodiment of the present disclosure. Unlike FIG. 5, the relative error of FIG. 7 fluctuates with temperature, however, this fluctuation occurs below the maximum relative error when the temperature sensing element is under a 50 nA biasing current, $I_{B1}$.

Figure 8:
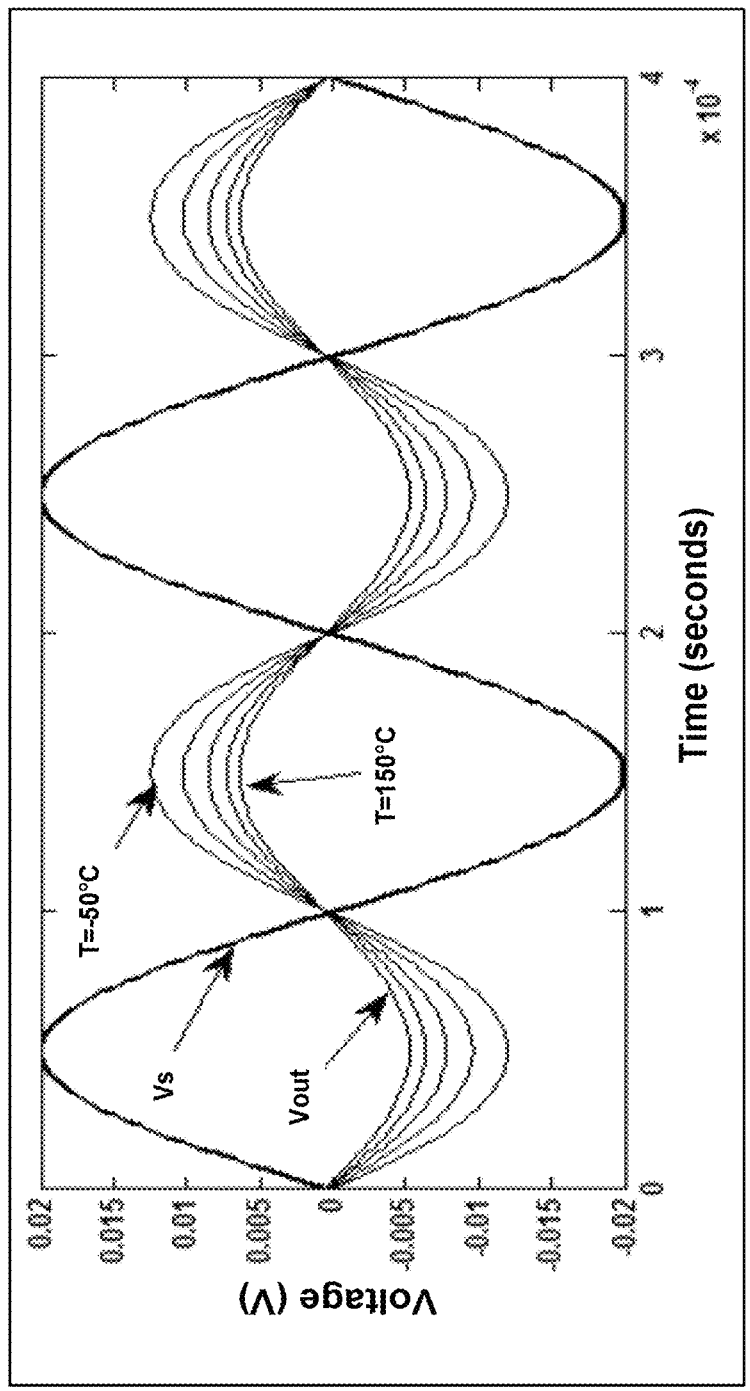
FIG. 8 is a graphical representation of the input voltage limitation as a function of the biasing current, according to an exemplary embodiment of the present disclosure.

To ensure the time-dependent function of the sensor, the temperature sensing element was simulated across a range of temperatures for duration of 4 ms. FIG. 8 is a graphical representation of the performance of the temperature sensing element under a biasing current of 50 nA ($I_{B1}$=50 nA), according to an exemplary embodiment of the present disclosure. Wherein the thick black line indicates the AC source voltage ($V_s$) and the thin black lines indicate multiple embodiments of voltage differential ($V_{out}$), it can be observed that the resistance of the system increases with increasing temperature. With an AC source voltage, VS, equal to ±20 mV, this manifests as a decrease from an output voltage differential of ~±12.5 mV at −50° C. to an output voltage differential of ~±5 mV at 150° C.

Figure 9:
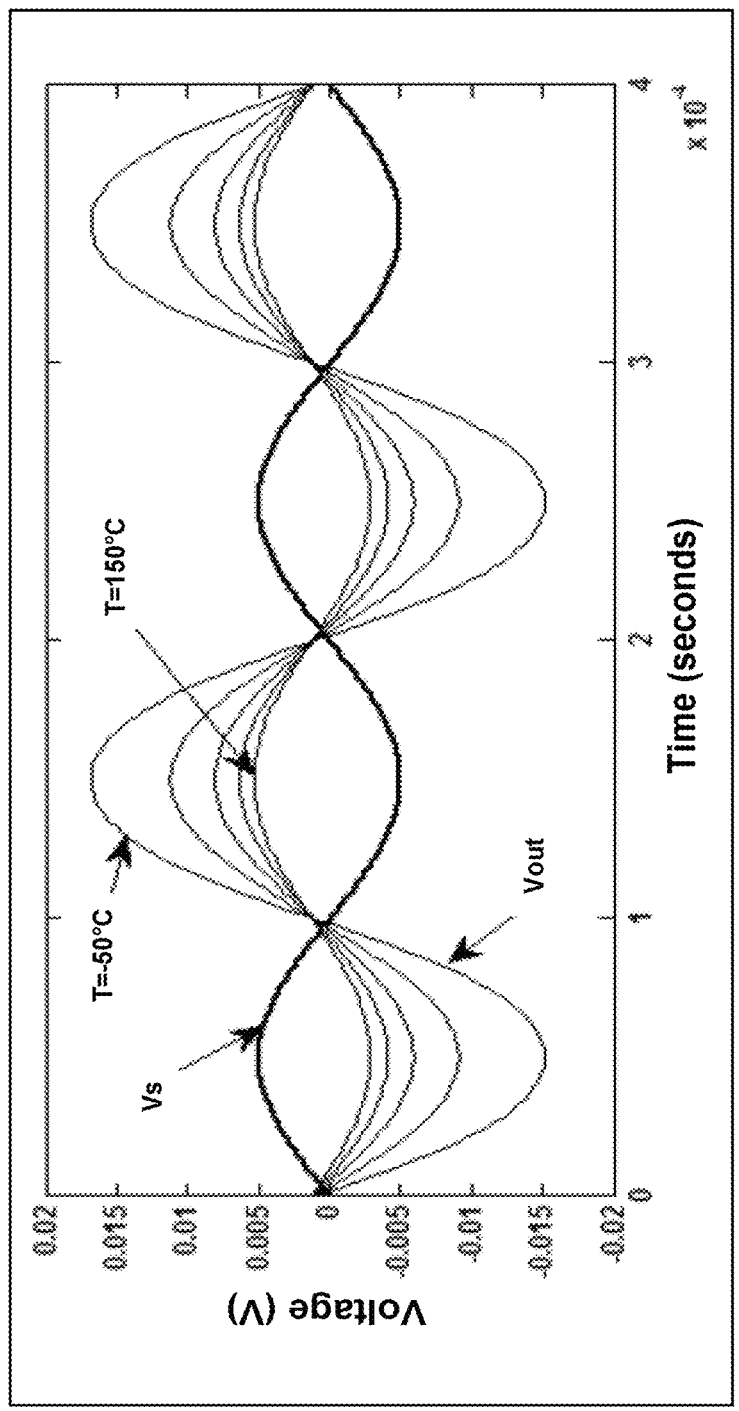
FIG. 9 is a graphical representation of the input voltage limitation as a function of the biasing current, according to an exemplary embodiment of the present disclosure.

As the temperature sensing element displays negative resistance, described by an inverse relationship between voltage and current, the circuit design can be exploited to amplify and detect a signal simultaneously, as shown in FIG. 9. FIG. 9 is a graphical representation of the performance of the circuit under a biasing current of 100 nA ($I_{B1}$=100 nA), according to an exemplary embodiment of the present disclosure. Wherein the thick black line indicates the AC source voltage, (VS) and the thin black lines indicate multiple embodiments of voltage differential ($V_{out}$), it can be observed that the resistance of the system increases with increasing temperature. Because increasing the biasing current may drive the transistor out of the subthreshold forward saturation region, the AC source voltage, VS, is decreased to ±5 mV for the simulation. Via the increase in biasing current and subsequent decrease in supplied AC voltage, the simulation resulted in a decrease from an output voltage differential of ~±15 mV at −50° C. to an output voltage differential of ~2.5 mV at 150° C. Although not appropriate in all cases, in this embodiment, the exploitation of negative resistance allows for improved separation of the temperature-resistance relationships.

According to an exemplary embodiment of the present disclosure, biasing current can be adjusted to improve spatial measurements of voltages across an expected environmental temperature range. Moreover, the aspect ratio (W/L) of each transistor can be modified so that adjustments to the biasing current can be completed while maintaining all transistors in subthreshold forward saturation.

Table 2 compares the performance of the temperature sensing element of the present disclosure against temperature sensing elements readily available in the art. It can be seen that the design of the temperature sensing element of the present disclosure provides superior performance with respect to sensitivity, form factor, temperature range, and power consumption.

| Performance Comparison | | | | | |
| --- | --- | --- | --- | --- | --- |
| | Present Disclosure | Jeong, et al. | Li, et al. | Liangbo, et al. | Santos, et al. |
| Technology (μm) | 0.18 | 0.18 | 0.5 | 0.18 | — |
| Sensitivity (Ω/° C.) | 1000 | — | — | — | 4.5 |
| Temperature Range (° C.) | −50 to 150 | 0 to 100 | −40 to 100 | −40 to 100 | 0 to 150 |
| Supply Voltage (V) | ±0.5 | .2 | 2.5 to 5.5 | 1 to 1.8 | — |
| Power Consumption (nW) | 120 | 71 | 350 | 2200 | — |
| Relative Error (%) | 6 | 2.9 | 0.4 | 0.7 | — |
| Form Factor (mm²) | 0.006 | 0.09 | 0.55 | 0.517 | — |

In an exemplary embodiment, the temperature sensing element of the present disclosure is supplied by ±0.5 V DC and consumes 120 nW, allowing its implementation in applications where minimizing power consumption is critical to temperature monitoring including but not limited to battery-powered circuits.

According to an embodiment, the temperature sensor device is a standalone system used for discrete applications.

According to an embodiment, the temperature sensing element is incorporated in an integrated circuit as a component of a larger system, as alluded to below.

According to an exemplary embodiment of the present disclosure, the temperature sensing element and/or temperature sensing device can be connected to suitable data acquisition hardware, comprising at least a processing circuitry configured to receive, process, and display data received regarding a voltage of the temperature sensing unit or receive, process, and display data acquired from the temperature sensing device. The data acquisition hardware may be local to the temperature sensing element and/or temperature sensing device or may be in remote communication with the temperature sensing element and/or temperature sensing device via wireless communication (e.g., near-field communication). In an embodiment, the processing circuitry is further configured to determine a relationship between resistance and temperature and to calculate an unknown temperature value based upon the relationship.

Figure 10:
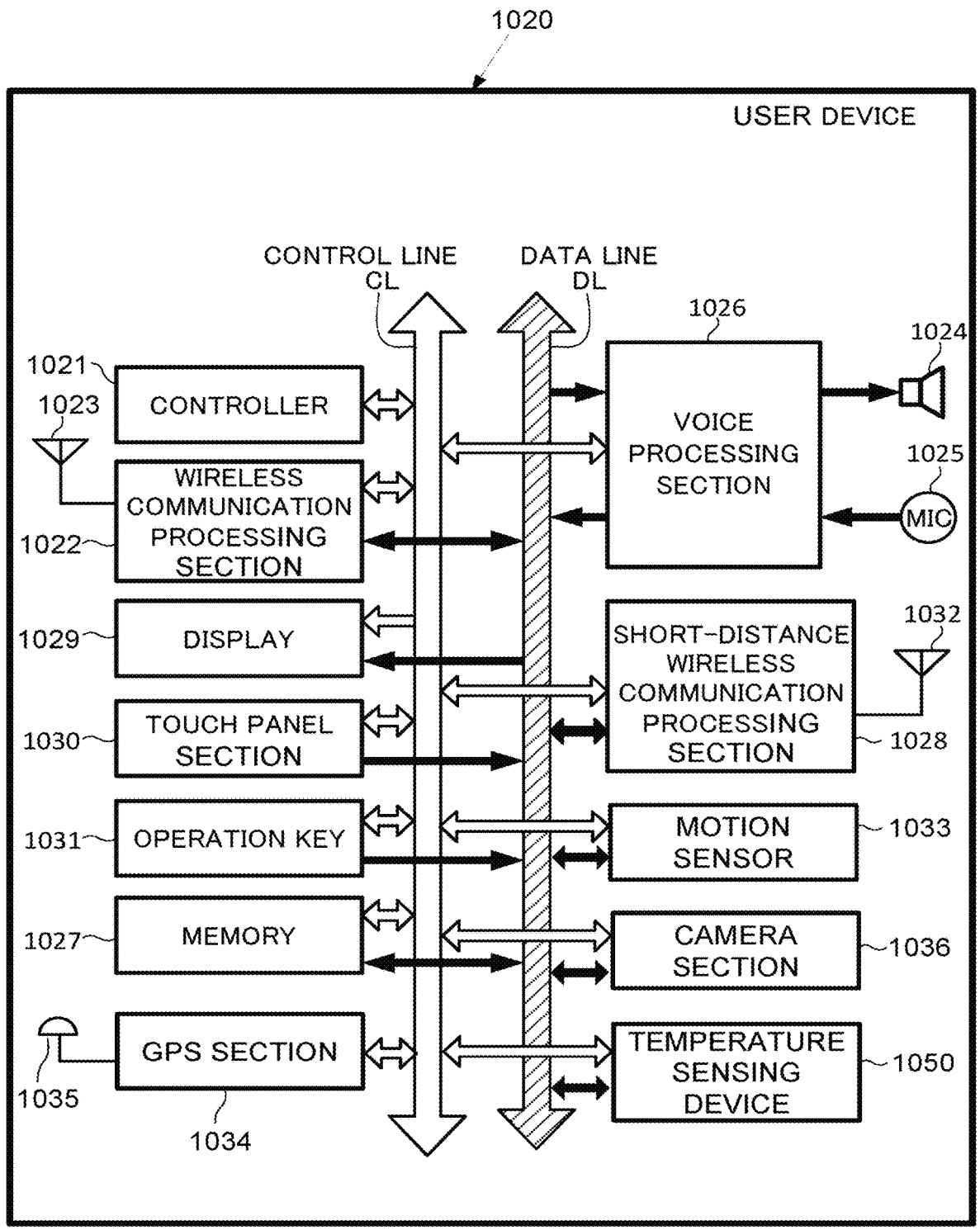
FIG. 10 is a block diagram illustrating an exemplary user device, employing the temperature sensing device of the present disclosure, according to certain embodiments of the present disclosure.

FIG. 10 is a more detailed block diagram illustrating an exemplary user device 1020, employing the temperature sensing device of the present disclosure, according to certain embodiments of the present disclosure. In certain embodiments, user device 1020 may be a smartphone. However, the skilled artisan will appreciate that the features described herein may be adapted to be implemented on other devices (e.g., a laptop, a tablet, a server, an e-reader, a camera, a navigation device, a wearable technology, etc.). The exemplary user device 1020 of FIG. 10 includes a controller 1021 and a wireless communication processor 1022 connected to an antenna 1023. A speaker 1024 and a microphone 1025 are connected to a voice processor 1026.

The controller 1021 is an example of a control unit and may include one or more Central Processing Units (CPUs), and may control each element in the user device 1020 to perform functions related to communication control, audio signal processing, control for the audio signal processing, still and moving image processing and control, and other kinds of signal processing. The controller 1021 may perform these functions by executing instructions stored in a memory 1027. Alternatively or in addition to the local storage of the memory 1027, the functions may be executed using instructions stored on an external device accessed on a network or on a non-transitory computer readable medium. In an exemplary embodiment of the present disclosure, the controller 1021 is utilized for processing data received from a temperature sensing device 1050.

The memory 1027 is an example of a storage unit and includes but is not limited to Read Only Memory (ROM), Random Access Memory (RAM), or a memory array including a combination of volatile and non-volatile memory units. The memory 1027 may be utilized as working memory by the controller 1021 while executing the processes and algorithms of the present disclosure. Additionally, the memory 1027 may be used for long-term storage, e.g., of image data and information related thereto. The memory 1027 may be configured to store temperature information acquired from the temperature sensor.

The user device 1020 includes a control line CL and data line DL as internal communication bus lines. Control data to/from the controller 1021 may be transmitted through the control line CL. The data line DL may be used for transmission of voice data, display data, etc.

The speaker 1024 emits an audio signal corresponding to audio data supplied from the voice processor 1026. The microphone 1025 detects surrounding audio and converts the detected audio into an audio signal. The audio signal may then be output to the voice processor 1026 for further processing. The voice processor 1026 demodulates and/or decodes the audio data read from the memory 1027 or audio data received by the wireless communication processor 1022 and/or a short-distance wireless communication processor 1028. Additionally, the voice processor 1026 may decode audio signals obtained by the microphone 1025.

The exemplary user device 1020 may also include a display 1029, a touch panel 1030, an operation key 1031, and a short-distance communication processor 1028 connected to an antenna 1032. The display 1029 may be a Liquid Crystal Display (LCD), an organic electroluminescence display panel, or another display screen technology. In addition to displaying still and moving image data, the display 1029 may display operational inputs, such as numbers or icons which may be used for control of the user device 1020. The display 1029 may additionally display a GUI for a user to control aspects of the user device 1020 and/or other devices. Further, the display 1029 may display characters and images received by the user device 1020 and/or stored in the memory 1027 or accessed from an external device on a network. For example, the user device 1020 may access a network such as the Internet and display text and/or images transmitted from a Web server.

The touch panel 1030 may include a physical touch panel display screen and a touch panel driver. The touch panel 1030 may include one or more touch sensors for detecting an input operation on an operation surface of the touch panel display screen.

In certain aspects of the present disclosure, the touch panel 1030 may be disposed adjacent to the display 1029 (e.g., laminated) or may be formed integrally with the display 1029. For simplicity, the present disclosure assumes the touch panel 1030 is formed integrally with the display 1029 and therefore, examples discussed herein may describe touch operations being performed on the surface of the display 1029 rather than the touch panel 1030. However, the skilled artisan will appreciate that this is not limiting.

The touch panel driver may be included in the touch panel 1030 for control processing related to the touch panel 1030, such as scanning control.

The touch panel 1030 and the display 1029 may be surrounded by a protective casing, which may also enclose the other elements included in the user device 1020.

Further, in certain embodiments, the controller 1021 may be configured to detect which hand is holding the user device 1020, based on the detected finger position.

The operation key 1031 may include one or more buttons or similar external control elements, which may generate an operation signal based on a detected input by the user. In addition to outputs from the touch panel 1030, these operation signals may be supplied to the controller 1021 for performing related processing and control. In certain aspects of the present disclosure, the processing and/or functions associated with external buttons and the like may be performed by the controller 1021 in response to an input operation on the touch panel 1030 display screen rather than the external button, key, etc. In this way, external buttons on the user device 1020 may be eliminated in lieu of performing inputs via touch operations, thereby improving water-tightness.

The antenna 1032 may transmit/receive electromagnetic wave signals to/from other external apparatuses, and the short-distance wireless communication processor 1028 may control the wireless communication performed between the other external apparatuses. Bluetooth, IEEE 802.11, and near-field communication (NFC) are non-limiting examples of wireless communication protocols that may be used for inter-device communication via the short-distance wireless communication processor 1028.

The user device 1020 may include a motion sensor 1033. The motion sensor 1033 may detect features of motion (i.e., one or more movements) of the user device 1020. The motion sensor 1033 can work in conjunction with a Global Positioning System (GPS) section 1034. The GPS section 1034 detects the present position. The information of the present position detected by the GPS section 1034 is transmitted to the controller 1021. An antenna 1035 is connected to the GPS section 1034 for receiving and transmitting signals to and from a GPS satellite.

The user device 1020 may include the temperature sensing device 1050. In an exemplary embodiment, the temperature sensing device 1050 comprises the temperature sensing element described in the present disclosure.

The user device 1020 may include a camera section 1036, which includes a lens and shutter for capturing photographs of the surroundings around the user device 1020.

Because the apparatus implementing the present invention is, for the most part, composed of electronic components and circuits known to those skilled in the art, circuit details have not been explained in any greater extent that that considered necessary as illustrated above, for the understanding and appreciation of the underlying concepts of the present invention and in order not to obfuscate or distract from the teachings of the present invention.

Obviously, numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A temperature measurement and information system, comprising:
  a user device including a controller, a wireless communication processor connected to an antenna and a display;
  a temperature sensing device, comprising:
    a first circuit segment;
    a second circuit segment; and
    a processing circuitry,
  wherein the first circuit segment includes one or more metal-oxide-semiconductor field effect transistors of a first conductivity type, wherein the second circuit segment includes one or more metal-oxide-semiconductor field effect transistors of a second conductivity type, and wherein the processing circuitry is configured to determine a temperature associated with the temperature sensing device, based upon a relationship between a resistance of the second circuit segment and the temperature, wherein the user device is in wireless communication with the temperature sensing device;

wherein the relationship between the resistance of the second circuit segment and the temperature is defined by $$R_{eq} = -\frac{4nkT}{qI_B},$$

where $R_{eq}$ is the resistance of the second circuit segment, n is a subthreshold slope factor, k is the Boltzmann constant (k=8.617×10$^{-5}$ eV/k), T is the temperature in Kelvin, q is the electric charge of an electron (q=1.602×10$^{-19}$ coulombs), and $I_B$ is a biasing current, wherein the processing circuitry is configured to measure a first value from a voltage of an output signal from the first circuit segment, and a second value from the voltage of the output signal from the second circuit segment, and calculate a difference between the first value and the second value, wherein the resistance of the second circuit segment is determined using $I_B$ and the difference between the first value and the second value.

2. The temperature measurement and information system according to claim 1, wherein one or more gates of the one or more metal-oxide-semiconductor field effect transistors of the second circuit segment are cross-coupled.

3. The temperature measurement and information system according to claim 1, wherein the one or more metal-oxide-semiconductor field effect transistors of the first conductivity type are operated in the subthreshold region.

4. The temperature measurement and information system according to claim 1, wherein the one or more metal-oxide-semiconductor field effect transistors of the second conductivity type are operated in the subthreshold region.

5. The temperature measurement and information system according to claim 1, wherein the one or more metal-oxide-semiconductor field effect transistors of the first conductivity type are p-type, n-type, or a combination thereof.

6. The temperature measurement and information system according to claim 1, wherein the one or more metal-oxide semiconductor field effect transistors of the second conductivity type are p-type, n-type, or a combination thereof.

7. The temperature measurement and information system according to claim 1,
wherein a voltage output of the second circuit segment is inversely related to a current output of the first circuit segment.

8. The temperature measurement and information system according to claim 1, wherein a biasing current is applied to the first circuit segment, the second circuit segment, or a combination thereof.

9. A method of measuring and communicating a temperature, comprising:
generating, via a power supply, a signal having a voltage;
receiving the signal having the voltage to one or more metal-oxide-semiconductor field effect transistors of a first conductivity type of a first circuit segment of a temperature sensing device;
transmitting the signal having the voltage from the first circuit segment;
measuring, via a processing circuitry of the temperature sensing device, a first value from the voltage of the output signal from the first circuit segment;
receiving the signal having the voltage to one or more metal-oxide-semiconductor field effect transistors of a second conductivity type of a second circuit segment of the temperature sensing device;
transmitting the signal having the voltage from the second circuit segment;
measuring, via the processing circuitry, a second value from the voltage of the output signal from the second circuit segment;
calculating, via the processing circuitry, a difference between the first value from the voltage output signal from the first circuit segment and the second value from the voltage of the output signal from the second circuit segment, and
determining, via the processing circuitry, a temperature associated with the temperature sensing device, based upon a relationship between a resistance of the second circuit segment and the temperature,
wherein the relationship between the resistance of the second circuit segment and the temperature is defined by $$R_{eq} = -\frac{4nkT}{qI_B},$$

where $R_{eq}$ is the resistance of the second circuit segment, n is a subthreshold slope factor, k is the Boltzmann constant (k=8.617×10$^{-5}$ eV/k), T is the temperature in Kelvin, q is the electric charge of an electron (q=1.602×10$^{-19}$ coulombs), and $I_B$ is a biasing current,
wherein the resistance of the second circuit segment is determined using $I_B$ and the difference between the first value and the second value;
wirelessly transmitting the temperature to a user device wirelessly connected to a temperature sensing device, wherein the user device includes a controller, a wireless communication processor connected to an antenna and a display; and
displaying the temperature on the device of the user device.

10. The method according to claim 9, wherein one or more gates of the one or more metal-oxide-semiconductor field effect transistors of the second circuit segment are cross-coupled.

11. The method according to claim 9, wherein the one or more metal-oxide-semiconductor field effect transistors of the first conductivity type are operated in the subthreshold region.

12. The method according to claim 9, wherein the one or more metal-oxide-semiconductor field effect transistors of the second conductivity type are operated in the subthreshold region.

13. The method according to claim 9, wherein the one or more metal-oxide-semiconductor field effect transistors of the first conductivity type are p-type, n-type, or a combination thereof.

14. The method according to claim 9, wherein the one or more metal-oxide semiconductor field effect transistors of the second conductivity type are p-type, n-type, or a combination thereof.

15. The method according to claim 9, wherein a biasing current is applied to the first circuit segment, the second circuit segment, or a combination thereof.

* * * * *